(12) United States Patent
Kim et al.

(10) Patent No.: US 10,429,893 B2
(45) Date of Patent: Oct. 1, 2019

(54) FLEXIBLE DISPLAY DEVICE, FOLDABLE ELECTRONIC DEVICE INCLUDING THE SAME, AND METHOD OF MANUFACTURING FLEXIBLE DISPLAY DEVICE

(71) Applicant: Samsung Electronics Co., Ltd., Suwon-si, Gyeonggi-do (KR)

(72) Inventors: Jun-hyung Kim, Yongin-si (KR); Won-ho Lee, Suwon-si (KR); Ho-seong Seo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 504 days.

(21) Appl. No.: 14/575,469

(22) Filed: Dec. 18, 2014

(65) Prior Publication Data

US 2015/0185782 A1    Jul. 2, 2015

(30) Foreign Application Priority Data

Dec. 30, 2013  (KR) .......................... 10-2013-0167014

(51) Int. Cl.
*G06F 1/16* (2006.01)
*G02F 1/1333* (2006.01)
*H01L 51/00* (2006.01)

(52) U.S. Cl.
CPC ...... *G06F 1/1652* (2013.01); *G02F 1/133305* (2013.01); *G06F 1/166* (2013.01); *G06F 1/1616* (2013.01); *G06F 1/1643* (2013.01); *G06F 1/1679* (2013.01); *H01L 51/0097* (2013.01); *G06F 2203/04102* (2013.01); *H01L 2251/5338* (2013.01); *Y10T 156/1028* (2015.01)

(58) Field of Classification Search
CPC ......... G06F 2203/04102; G06F 1/1652; G06F 1/1616; H01L 2251/5338; H01L 51/0097; G02F 1/133305
See application file for complete search history.

(56) References Cited

U.S. PATENT DOCUMENTS

| 2006/0132025 | A1* | 6/2006 | Gao ........................ H01L 51/52 313/503 |
| 2010/0002402 | A1 | 1/2010 | Rogers et al. |
| 2012/0314399 | A1 | 12/2012 | Bohn et al. |
| 2013/0010405 | A1 | 1/2013 | Rothkopf et al. |
| 2013/0037228 | A1* | 2/2013 | Verschoor ............. G06F 1/1652 160/377 |
| 2013/0050130 | A1* | 2/2013 | Brown ................... G06F 3/044 345/174 |
| 2013/0308076 | A1* | 11/2013 | Yasumatsu ............. G09F 9/301 349/84 |
| 2014/0042293 | A1* | 2/2014 | Mok ..................... G06F 1/1652 248/682 |

* cited by examiner

*Primary Examiner* — Alexander P Gross
(74) *Attorney, Agent, or Firm* — Jefferson IP Law, LLP

(57) ABSTRACT

A flexible display device that may fold so that a neutral surface has a radius of curvature is provided. The flexible display device includes a plurality of panel layers that are sequentially stacked on one another and comprise a display panel layer configured to display an image and a transparent protective panel layer; and adhesive layers that sequentially adhere the plurality of panel layers to one another. An elastic modulus and a thickness of each of the adhesive layers and the plurality of panel layers are determined so that a neutral surface is located on a layer other than the display panel layer.

2 Claims, 14 Drawing Sheets

US 10,429,893 B2

FLEXIBLE DISPLAY DEVICE, FOLDABLE ELECTRONIC DEVICE INCLUDING THE SAME, AND METHOD OF MANUFACTURING FLEXIBLE DISPLAY DEVICE

CROSS-REFERENCE TO RELATED APPLICATION(S)

This application claims the benefit under 35 U.S.C. § 119(a) of a Korean patent application filed on Dec. 30, 2013 in the Korean Intellectual Property Office and assigned Serial number 10-2013-0167014, the entire disclosure of which is hereby incorporated by reference.

TECHNICAL FIELD

The present disclosure relates to a flexible display device which may bend and unfold, a method of manufacturing the flexible display device, and a foldable electronic device including the flexible display device.

BACKGROUND

A portable foldable device, (hereinafter, referred to as a mobile device), such as a communication terminal, a game player, a multimedia device, a portable computer, a photographing apparatus, and the like, includes a display device that displays image information and an input unit, such as a keypad. Many mobile devices include a foldable structure that may fold into a smaller size in order to improve portability. In such mobile devices, two bodies are connected to each other by using the foldable structure. Since a display device of the related art may not fold, the display device of the related art may be disposed on any one of the two bodies. Hence, it is difficult to apply a large display device to a mobile device including a foldable structure.

As a flexible display device that may bend has been developed, attempts have been made to apply the flexible display device to a mobile device including a foldable structure. In this case, since the flexible display device including a flexible display panel and a plurality of optical functional layers may be disposed over two bodies across the foldable structure, a large screen may be provided. The plurality of optical functional layers may include, for example, a transparent protective panel layer and an optically-clear adhesive layer (OCAL).

In a multi-layer film structure, such as a flexible display device, as a radius of curvature decreases, delamination, whereby films are separated from each other, may occur.

Therefore, a need exists for a flexible display device having a multi-layer structure, a method of manufacturing the flexible display device, and a foldable electronic device using the flexible display device which may reduce the risk of delamination.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a flexible display device having a multi-layer structure, a method of manufacturing the flexible display device, and a foldable electronic device using the flexible display device which may reduce the risk of delamination.

Additional aspects will be set forth in part in the description which follows and, in part, will be apparent from the description, or may be learned by practice of the presented embodiments of the present disclosure.

In accordance with an aspect of the present disclosure, a flexible display device that is foldable so that a neutral surface has a radius of curvature is provided. The flexible display device includes a plurality of panel layers that are sequentially stacked on one another and include a display panel layer configured to display an image, and a transparent protective panel layer, and adhesive layers that sequentially adhere the plurality of panel layers to one another, wherein an elastic modulus and a thickness of each of the adhesive layers and the plurality of panel layers are determined so that the neutral surface is located on a layer other than the display panel layer.

The flexible display device may further include a touch panel layer that is disposed between the display panel layer and the transparent protective panel layer, wherein the adhesive layers include a first adhesive layer that adheres the touch panel layer to the display panel layer and a second adhesive layer that adheres the touch panel layer to the transparent protective panel layer.

The transparent protective panel layer may form an inner surface layer in a bending state, and the display panel layer may form an outer surface layer in the bending state.

An elastic modulus and a thickness of each of the adhesive layers and the plurality of panel layers may be determined so that the neutral surface is located between the display panel layer and the transparent protective panel layer.

A position of the neutral surface may be determined so that when the flexible display device folds, the transparent protective panel layer and the display panel layer simultaneously reach a yield strain.

An elastic modulus and a thickness of each of the adhesive layers and the plurality of panel layers may be determined so that when the flexible display device folds, the transparent protective panel layer and the display panel layer simultaneously reach a yield strain.

When a distance between an outer surface of the display panel layer and each of central planes of the adhesive layers and the plurality of panel layers in a thickness direction is Pi, a distance between the outer surface of the display panel layer and the neutral surface is $y_N$, a yield strain of the adhesive layers and the plurality of panel layers is $\varepsilon_{Yi}$, and a radius of curvature of the flexible display device is r, an elastic modulus and a thickness of each of the adhesive layers and the plurality of panel layers may be determined to satisfy $$r > \frac{|P_i - y_N|}{\varepsilon_{Yi}}. \qquad \text{Equation 1}$$

When a thickness of each of the adhesive layers and the plurality of panel layers is Ti and a length of a fine air-void of the adhesive layers is L, an elastic modulus and a thickness of each of the adhesive layers and the plurality of panel layers may be determined to satisfy $$r > \frac{12L^2|P_i - y_N|}{\pi^2 T_i^2}. \qquad \text{Equation 2}$$

A yield strain of the transparent protective layer and the display panel layer may be equal to or greater than 0.01.

The transparent protective panel layer may be plastic-deformed to a radius of curvature that is less than double the radius of curvature and may be adhered to another panel layer that is adjacent to the transparent protective panel layer.

In accordance with another aspect of the present disclosure, a method of manufacturing a flexible display device having a multi-layer structure in which a plurality of panel layers are sequentially adhered to one another is provided. The method includes forming a first curvature portion by plastic-deforming a first panel layer, and adhering the first panel layer to a second panel layer.

The adhering may include supporting the second panel layer on a jig including a second curvature portion that corresponds to the first curvature portion, and adhering the plastic-deformed first panel layer to the second panel layer.

The second panel layer may be plastic-deformed to include the first curvature portion and is supported on the jig.

The adhering may include supporting the second panel layer on a flat jig, and elastic-deforming the first panel layer to be spread flat and adhering the elastic-deformed first panel layer to the second panel layer.

The second panel layer may include a display panel layer that displays an image, and the first panel layer includes a transparent protective panel layer.

A radius of curvature of the first curvature portion may be equal to or less than double a minimum radius of curvature of the flexible display device.

In accordance with another aspect of the present disclosure, a foldable electronic device is provided. The foldable electronic device includes first and second bodies that are spaced apart from each other, a connection unit that is disposed between the first and second bodies and connects the first and second bodies so that the first and second bodies fold/unfold to a radius of curvature, and a flexible display device that is foldable so that a neutral surface has a radius of curvature, and including a plurality of panel layers that are sequentially stacked on one another and include a display panel layer configured to display an image, and a transparent protective panel layer, and adhesive layers that sequentially adhere the plurality of panel layers to one another, wherein an elastic modulus and a thickness of each of the adhesive layers and the plurality of panel layers are determined so that the neutral surface is located on a layer other than the display panel layer.

The foldable electronic device may further include a support member that changes between a first position at which the support member is received in the first body and a second position at which the support member extends to the second body across the connection unit, and a locking unit that is disposed on the second body and locks the support member that is located at the second position.

The support member may slide between the first and second positions.

The foldable electronic device may further include a locking member that includes the locking unit, and changes between a third position at which the locking unit locks the support member in a completely unfolded state of the first and second bodies and a fourth position at which the locking unit locks the support member that is located at the second position in a state having a certain angle between the completely unfolded state and a completely folded state of the first and second bodies.

The locking member may pivot between the third and fourth positions.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide.

Figure 1:
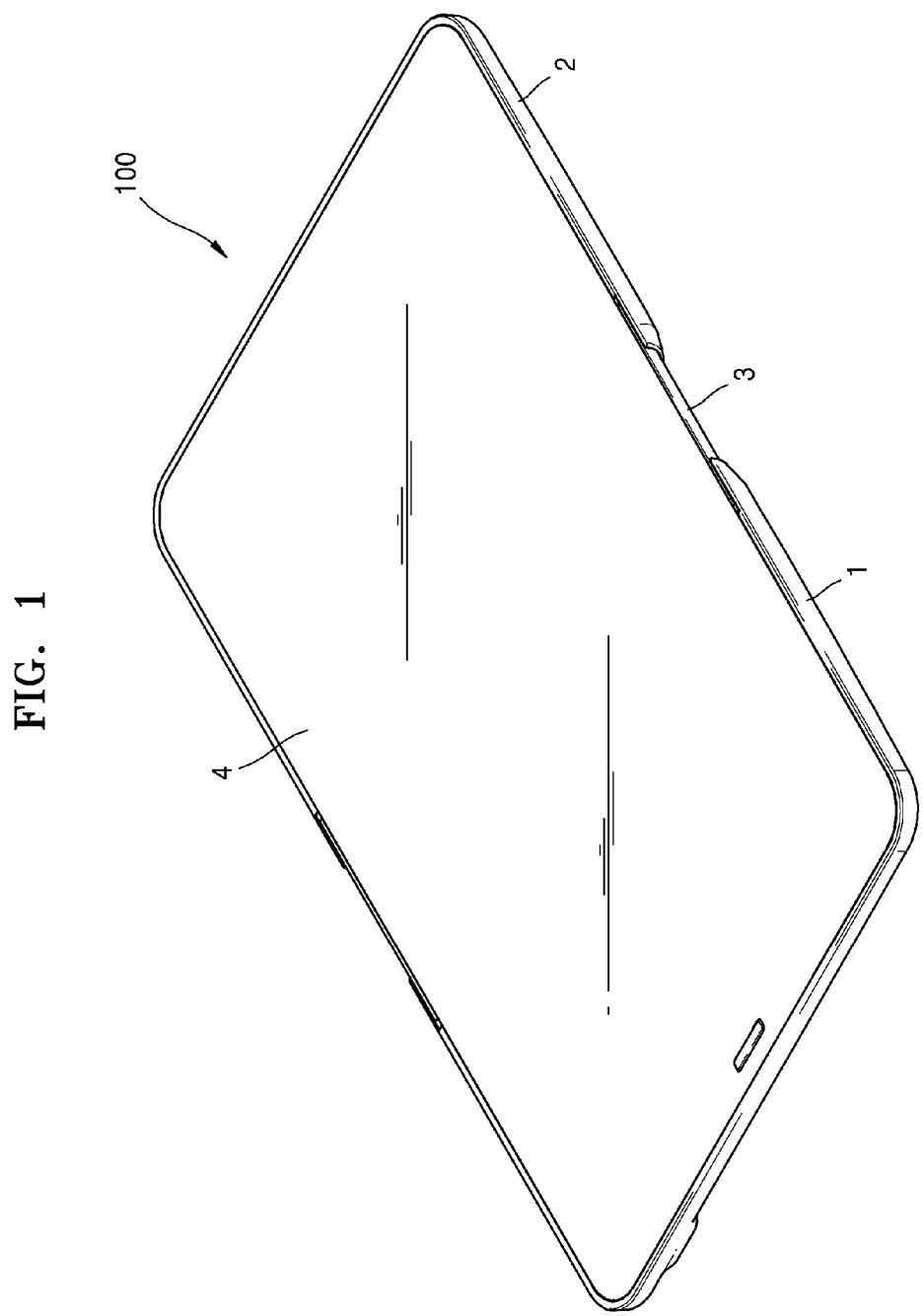
FIG. 1 is a perspective view illustrating an outer appearance of a foldable electronic device according to an embodiment of the present disclosure.
Figure 2:
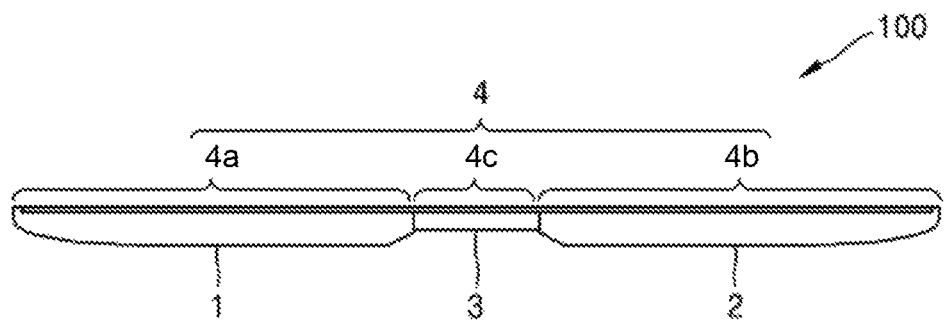
FIG. 2 is a side view illustrating an unfolded state of a foldable electronic device according to an embodiment of the present disclosure.
Figure 3:
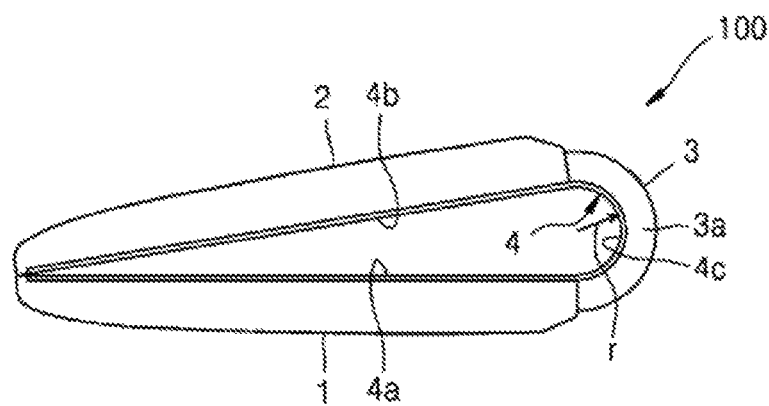
FIG. 3 is a side view illustrating a folded state of a foldable electronic device according to an embodiment of the present disclosure.

FIG. 1 is a perspective view illustrating an outer appearance of a foldable electronic device according to an embodiment of the present disclosure. FIG. 2 is a side view illustrating an unfolded state of a foldable electronic device according to an embodiment of the present disclosure. FIG. 3 is a side view illustrating a folded state of a foldable electronic device according to an embodiment of the present disclosure.

Referring to FIGS. 1, 2, and 3, a foldable electronic device 100 includes first and second bodies 1 and 2, a flexible display device 4, and a connection unit 3. The flexible display device 4 is supported on the first and second bodies 1 and 2. For example, the flexible display device 4 may be adhered to the first and second bodies 1 and 2 by using an adhesive unit, such as an adhesive or a double-sided tape. The connection unit 3 is disposed between the first and second bodies 1 and 2, and connects the first and second bodies 1 and 2 so that the first and second bodies 1 and 2 may fold/unfold to have a radius of curvature r. For example, a radius of curvature of a neutral surface NS (see FIG. 4) of the flexible display device 4 is r in the folded state due to the connection unit 3.

The foldable electronic device 100 may be a portable mobile device, such as a communication terminal, a game player, a multimedia device, a portable computer, a photographing apparatus, and the like. However, the present embodiment of the present disclosure is not limited thereto, and the foldable electronic device 100 may be any device as long as it includes the first body 1 that is coupled to a first part 4a of the flexible display device 4 and the second body 2 that is coupled to a second part 4b of the flexible display device 4 and is foldably connected to the first body 1 through the connection unit 3.

A processing unit (not shown) and an input/output unit (not shown) for performing functions according to the use of the foldable electronic device 100 may be provided on the first and second bodies 1 and 2. When the foldable electronic device 100 is a multimedia terminal that provides an image and music to a user, the processing unit may include an image/audio information processing unit. When the foldable device is a communication terminal, the processing unit may include a communication module. The input/output unit may include an image/audio input/output unit and a manipulation unit (not shown) for the user's manipulation. The manipulation unit may be realized by using a touch panel that is integrated into the flexible display device 4.

The flexible display device 4 may be divided into the first part 4a that is coupled to the first body 1, the second part 4b that is coupled to the second body 2, and a third part 4c that is formed between the first and second bodies 1 and 2. The third part 4c of the flexible display device 4 is not fixed to the connection unit 3. As the third part 4c of the flexible display device 4 bends, the foldable electronic device 100 may fold as shown in FIG. 3. The connection unit 3 is located outside the flexible display device 4 when the foldable electronic device 100 folds, and forms a curved portion 3a having a curvature as shown in FIG. 3. Since the connection unit 3 no longer bends in this state, the third part 4c of the flexible display device 4 may be protected from sharply bending. The curvature of the curved portion 3a corresponds to the radius of curvature r of the neutral surface NS (see FIG. 4) of the flexible display device 4.

Figure 4:
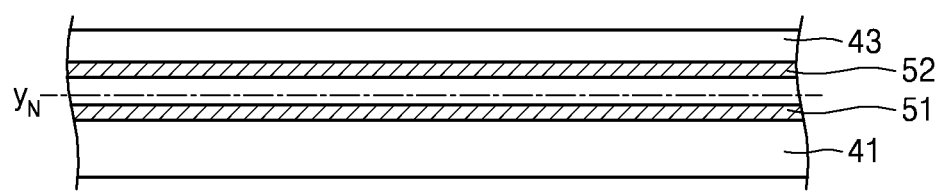
FIG. 4 is a cross-sectional view illustrating a flexible display device according to an embodiment of the present disclosure.

FIG. 4 is a cross-sectional view illustrating a flexible display device according to an embodiment of the present disclosure.

Referring to FIG. 4, the flexible display device 4 may include a plurality of panel layers that are sequentially adhered to one another by using an adhesive layer. The panel layers may include, for example, a display panel layer 41 that displays an image and a transparent protective panel layer 43 that is disposed outside the display panel layer 41. At least one adhesive layer is disposed between the display panel layer 41 and the transparent protective panel layer 43.

The panel layers may further include a touch panel layer 42 as an input unit. The at least one adhesive layer may include first and second adhesive layers 51 and 52 that adhere the touch panel layer 42 to the display panel layer 41 and the transparent protective panel layer 43. The first and second adhesive layers 51 and 52 are optically-clear adhesive layers (OCALs). However, the present embodiment of the present disclosure is not limited thereto, and the flexible display device 4 may further include various other optical panel layers and adhesive layers for adhering the optical panel layers to one another.

The display panel layer 41 may be, for example, an organic light-emitting diode (OLED) panel layer. When the display panel layer 41 is an OLED panel layer, an organic light-emitting layer may be disposed between an upper substrate and a lower substrate. A polarization plate may be disposed on the upper substrate from which light is emitted.

Figure 5:
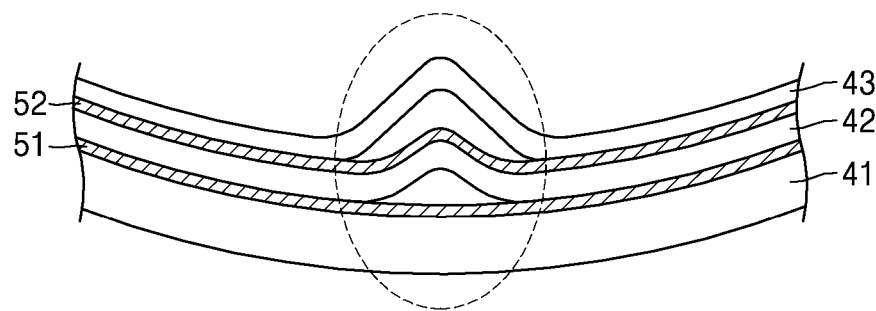
FIG. 5 is a cross-sectional view illustrating a flexible display device that undergoes delamination according to an embodiment of the present disclosure.

FIG. 5 is a cross-sectional view illustrating a flexible display device that undergoes delamination according to an embodiment of the present disclosure.

Assuming that the plurality of panel layers are adhered to one another as described above, when the flexible display device 4 repeatedly changes between the unfolded state of FIG. 2 and the folded state of FIG. 3, delamination may occur as shown in FIG. 5.

When the flexible display device 4 bends, a compressive force is produced inside a bending direction and a tensile force is produced outside the bending direction.

Referring to FIG. 5, inner panel layers to which the compressive force is applied, that is, the transparent protective panel layer 43 and the touch panel layer 42, may be locally delaminated from the first and second adhesive layers 51 and 52, or the first and second adhesive layers 51 and 52 may be locally delaminated from the touch panel layer 42 and the display panel layer 41. Such delamination is not overcome even when the flexible display device 4 changes to the unfolded state of FIG. 2.

Such delamination occurs when a strain on each of the panel layers 41, 42, and 43 due to a compressive force or a tensile force exceeds a yield strain. Accordingly, as a yield strain of a material increases, a range in which the material may bend without delamination increases. For example, a material having a higher yield strain may bend to a smaller radius of curvature than a material having a lower yield strain.

Figure 6:
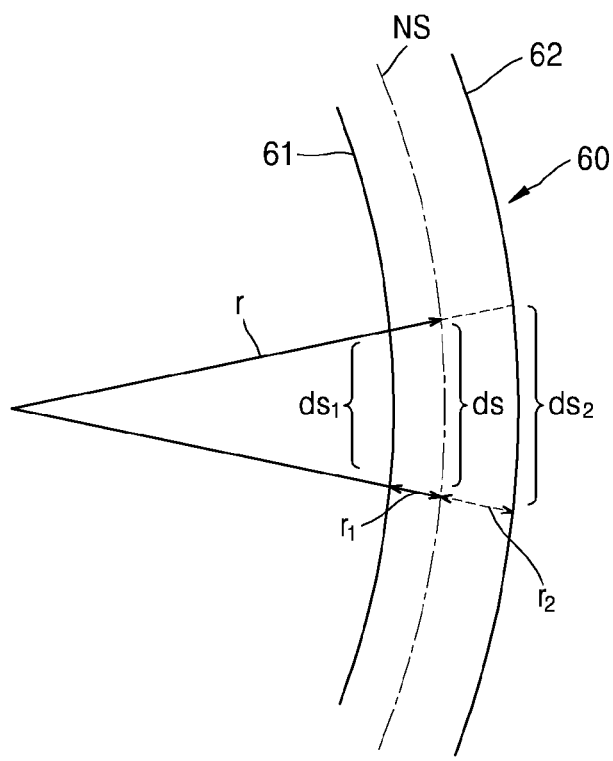
FIG. 6 illustrates a process of obtaining a minimum radius of curvature for avoiding delamination according to an embodiment of the present disclosure.

FIG. 6 illustrates a process of obtaining a minimum radius of curvature for avoiding delamination according to an embodiment of the present disclosure.

Referring to FIG. 6, when the NS of a film 60 bends to the radius of curvature r, strains on an inner surface 61 and an outer surface 62 are ε1 and ε2, and a yield strain of the film 60 is $\varepsilon_Y$, since $$dS = rd\theta \quad \text{Equation 3}$$

$$dS_1 = (r-r1)d\theta \quad \text{Equation 4, and}$$

$$dS_2 = (r+r2)d\theta \quad \text{Equation 5}$$

Equations 6 and 7 are obtained:

$$|\varepsilon 1| = \left|\frac{ds_1 - ds}{ds}\right| = \left|\frac{-r1}{r}\right| < \varepsilon_Y \quad r > \frac{r1}{\varepsilon_Y}, \text{ and} \quad \text{Equation 6}$$

$$|\varepsilon 2| = \left|\frac{ds_2 - ds}{ds}\right| = \left|\frac{r2}{r}\right| < \varepsilon_Y \quad r > \frac{r2}{\varepsilon_Y}. \quad \text{Equation 7}$$

Hence, analytically, the radius of curvature r has to be greater than a value obtained by dividing each of distances r1 and r2 between the neutral surface NS and the inner and outer surfaces 61 and 62 by the yield strain $\varepsilon_Y$.

Figure 7A:
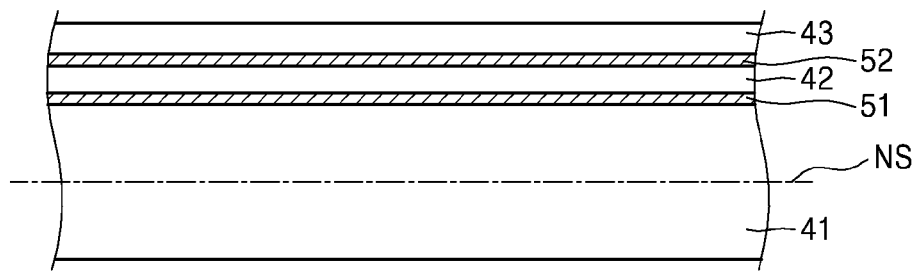
FIGS. 7A and 7B are cross-sectional views illustrating attempts to reduce a strain on a display panel layer during a bending process according to an embodiment of the present disclosure.
Figure 7B:
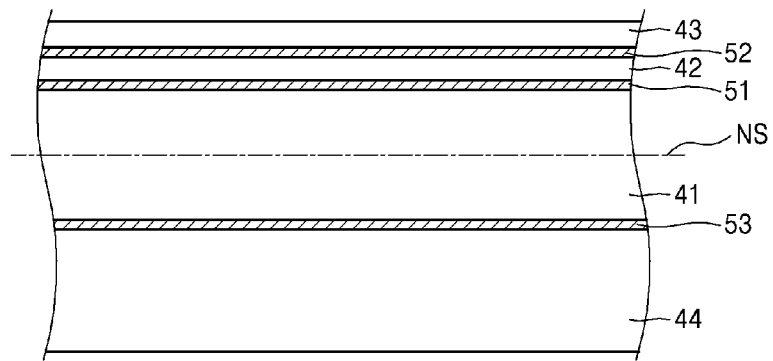

FIGS. 7A and 7B are cross-sectional views illustrating attempts to reduce a strain on a display panel layer during a bending process according to an embodiment of the present disclosure.

Referring to FIGS. 7A and 7B, in order to reduce a malfunction of the display panel layer 41, a strain on the display panel layer 41 may be reduced when the flexible display device 4 bends. To this end, the neutral surface NS of the flexible display device 4 may be located in the display panel layer 41. For example, a thickness of the display panel layer 41 may be increased as shown in FIG. 7A, or a support substrate 44 may be attached to the display panel layer 41 by using an adhesive layer 53 as shown in FIG. 7B. In this structure, since the neutral surface NS is located in the display panel layer 41, the distances $r_1$ and $r_2$ in Equations 6 and 7 are reduced. Accordingly, the strains ε1 and ε2 of the display panel layer 41 may be reduced when the flexible display device 4 bends. However, in this case, a total thickness of the flexible display device 4 increases and thus it is difficult to make the foldable electronic device 100 slim. In addition, since a distance between the neutral surface NS and the transparent protective panel layer 43 that is located inner side when the flexible display device 4 bends increases and thus a strain on the transparent protective panel layer 43 increases, a minimum radius of curvature to which the flexible display device 4 may bend without delamination increases. For example, when the distances r1 and r2 in Equations 6 and 7 increase, the minimum radius of curvature increases in proportion to the distances r1 and r2. Accordingly, it is difficult to fold the flexible display device 4 into a compact size.

In this regard, the flexible display device 4 of the present embodiment of the present disclosure is formed by sequentially stacking the display panel layer 41, the first adhesive layer 51, the touch panel layer 42, the second adhesive layer 52, and the transparent protective panel layer 43 as shown in FIG. 4. The display panel layer 41 is located outer side and the transparent protective panel layer 43 is located inner side when the flexible display device 4 bends as shown in FIG. 4. For example, in the flexible display device 4 having a multi-layer structure of the present embodiment of the present disclosure, the transparent protective panel layer 43 and the display panel layer 41 respectively form an inner surface layer and an outer surface layer and at least one adhesive layer is disposed between the inner surface layer and the outer surface layer. In addition, the neutral surface NS is formed between the transparent protective panel layer 43 and the display panel layer 41.

Position of Neutral Surface NS

A height $y_N$ of the neutral surface NS of the flexible display device 4 of FIG. 4 will now be obtained.

Figure 8:
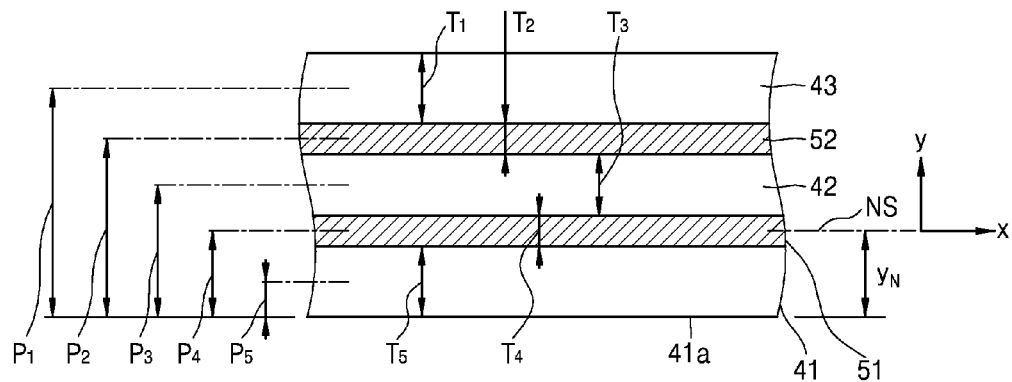
FIG. 8 is a reference view for obtaining a condition for avoiding delamination according to an embodiment of the present disclosure.

FIG. 8 is a reference view for obtaining a condition for avoiding delamination according to an embodiment of the present disclosure.

Referring to FIG. 8, $T_1$, $T_2$, $T_3$, $T_4$, and $T_5$ are respectively thicknesses of the transparent protective panel layer 43, the second adhesive layer 52, the touch panel layer 42, the first adhesive layer 51, and the display panel layer 41. $P_1$, $P_2$, $P_3$, $P_4$, and $P_5$ are respectively distances between an outer surface 41a of the display panel layer 41 and central planes of the transparent protective panel layer 43, the second adhesive layer 52, the touch panel layer 42, the first adhesive layer 51, and the display panel layer 41 in a thickness direction. $y_N$ is a distance between the outer surface 41a of the display panel layer 41 and the neutral surface NS. $E_1$, $E_2$, $E_3$, $E_4$, and $E_5$ are respectively elastic moduli of the transparent protective panel layer 43, the second adhesive layer 52, the touch panel layer 42, the first adhesive layer 51, and the display panel layer 41.

When the flexible display device 4 bends to the radius of curvature r of the neutral surface NS, a stress G, at a position at which a distance from the neutral surface NS is y is $$\sigma_i = E_i \varepsilon_i(y) \qquad \text{Equation 8}$$

Referring to Equations 6 and 7, since $$\varepsilon_i(y) = \frac{y}{r}, \qquad \text{Equation 9}$$

Equation 10 is obtained:

$$\sigma_i = E_i \frac{y}{r}. \qquad \text{Equation 10}$$

When a member having a flat plate-shape bends, an inner surface is compressed and an outer surface is tensed about a boundary surface between the inner surface and the outer surface. The boundary surface has no change in length thereof, which is referred to as a neutral surface. Accordingly, a sum of forces horizontally applied to the neutral surface is '0'. As such, since the neutral surface NS is a surface to which a sum of forces applied in an X-axis is '0', when the stress $\sigma_i$ is integrated with respect to an application area A, Equation 11 is obtained:

$$\sum_i \int_i \sigma_i \, dA = 0. \qquad \text{Equation 11}$$

When Equation 10 is applied to Equation 11, Equation 12 is obtained:

$$\sum_i E_i \int_i y \, dA = \sum_i \left[ E_i \int_i (y + y_N) \, dA - E_i \int_i y_N \, dA \right] = 0. \qquad \text{Equation 12}$$

When Equation 12 is solved, Equation 13 is obtained:

$$\sum_i [E_i P_i T_i] - y_N \sum_i [E_i T_i] = 0. \qquad \text{Equation 13}$$

The height $y_N$ of the neutral surface NS is $$y_N = \frac{\sum_i [E_i P_i T_i]}{\sum_i [E_i T_i]}. \qquad \text{Equation 14}$$

Hence, the height $y_N$ of the neutral surface NS in FIG. 8 is $$y_N = \frac{E_1 P_1 T_1 + E_2 P_2 T_2 + E_3 P_3 T_3 + E_4 P_4 T_4 + E_5 P_5 T_5}{E_1 T_1 + E_2 T_2 + E_3 T_3 + E_4 T_4 + E_5 T_5}. \qquad \text{Equation 15}$$

Accordingly, an elastic modulus and a thickness of each layer are determined so that the neutral surface NS that is calculated by using Equation 14 is located between the display panel layer 41 and the transparent protective panel layer 43.

Plastic Delamination

A condition for avoiding plastic delamination in the flexible display device 4 having the multi-layer structure of FIG. 4 will now be obtained.

When the flexible display device 4 bends to the radius of curvature r of the neutral surface NS, since a distance between the neutral surface NS and a central plane of each layer is $P_i - y_N$ and a distance between the neutral surface NS and two surfaces of each layer is $p_i - y_N \pm T_i/2$, a strains $\varepsilon_{i\text{-}center}$ of the central plane of each layer and a strain $\varepsilon_{i\text{-}surf}$ of the two surfaces of each layer are respectively $$\varepsilon_{i\text{-}center} = \frac{1}{r} |P_i - y_N|, \text{ and} \qquad \text{Equation 16}$$

$$\varepsilon_{i\text{-}surf} = \frac{1}{r} \left( P_i - y_N \pm \frac{T_i}{2} \right). \qquad \text{Equation 17}$$

When a strain on the central plane of each layer reaches the yield strain $\varepsilon_{Yi}$, half of the layer undergoes elastic deformation and the remaining half undergoes plastic deformation. In order to avoid delamination, theoretically, the strain $\varepsilon_{i\text{-}surf}$ on all surfaces of each layer has to be less than the yield strain $\varepsilon_{Yi}$. However, actually, when the strain $\varepsilon_{i\text{-}center}$ on the central plane of each layer is less than the yield strain $\varepsilon_{Yi}$ of each layer, delamination is avoided. Hence, the radius of curvature r of the neutral surface NS to which the flexible display device 4 may bend without delamination may range from $$\varepsilon_{Yi} > \varepsilon_{i\text{-}center} = \frac{1}{r} |P_i - y_N| \qquad \text{Equation 18 to}$$

$$r > \frac{|P_i - y_N|}{\varepsilon_{Yi}}. \qquad \text{Equation 19}$$

Accordingly, the radius of curvature r of the flexible display device 4 that bends by using the connection unit 3 may be determined based on an elastic modulus and a thickness of each layer to satisfy Equation 19. In addition, the flexible display device 4 may bend to a desired radius of curvature without delamination by adjusting an elastic modulus and a thickness of each layer.

For example, assuming that a condition of each layer in the flexible display device 4 having the multi-layer structure of FIG. 4 is as shown in Table 1, when a position of the neutral surface NS is obtained from Equation 14, the height $y_N$ of the neutral surface NS is 0.340. Assuming that the flexible display device 4 bends so that the radius of curvature r of the neutral surface NS is 5 mm, when the strain $\varepsilon_{i\text{-}center}$ of the central plane of each layer and the strain $\varepsilon_{i\text{-}surf}$ of the two surfaces of each layer are obtained by using Equations 16 and 17, Table 2 is obtained. The strain $\varepsilon_{i\text{-}surf}$ is a greater one from among strains of the two surfaces of each layer and "-" denotes tensile deformation.

TABLE 1

| | Thickness (T, mm) | Elastic modulus (E, Mpa) | Yield strain ($\varepsilon_Y$) |
|---|---|---|---|
| Transparent protective panel layer 43 | 0.115 | 2774 | 0.05 |
| Second adhesive layer 52 | 0.050 | 5 | 0.20 |
| Touch panel layer 42 | 0.110 | 428 | 0.05 |
| First adhesive layer 51 | 0.050 | 5 | 0.20 |
| Display panel layer 41 | 0.305 | 1361 | 0.05 |

TABLE 2

| | Yield strain ($\varepsilon_Y$) | $\varepsilon_{i\text{-}center}$ | $\varepsilon_{i\text{-}surf}$ |
|---|---|---|---|
| Transparent protective panel layer 43 | 0.05 | 0.047 | 0.058 |
| Second adhesive layer 52 | 0.20 | 0.030 | 0.035 |
| Touch panel layer 42 | 0.05 | 0.014 | 0.025 |
| First adhesive layer 51 | 0.20 | −0.002 | −0.007 |
| Display panel layer 41 | 0.05 | −0.037 | −0.068 |

Referring to Table 2, since the strain $\varepsilon_{i\text{-}center}$ of the central plane of each layer is less than the yield strain $\varepsilon_Y$ of each layer, the flexible display device 4 does not undergo delamination even when the flexible display device 4 bends to a radius of curvature of 5 mm. However, delamination is expected to occur when the radius of curvature is less than 5 mm.

Referring to Equation 14, the neutral surface Ns moves to a layer having a greater thickness or a layer having a greater elastic modulus E. In general, since elastic moduli of the first and second adhesive layers 51 and 52 are much less than elastic moduli of the transparent protective panel layer 43 and the display panel layer 41, thicknesses of the first and second adhesive layers 51 and 52 mainly affect a position of the neutral surface NS. When thicknesses of the first and second adhesive layers 51 and 52 increase, since distances between the neutral surface NS and the transparent protective panel layer 43 and the display panel layer 41 increase, even when the flexible display device 4 bends to the same curvature, strains of the transparent protective panel layer 43 and the display panel layer 41 increases. Hence, it is preferable that the first and second adhesive layers 51 and 52 are as thin as possible and have as higher adhesiveness as possible.

A position of the neutral surface NS is greatly affected by a thickness and an elastic modulus of each of the transparent protective panel layer 43 and the display panel layer 41. Strains of the transparent protective panel layer 43 and the display panel layer 41 may be adjusted with a given radius of curvature by moving the neutral surface NS by adjusting a thickness and an elastic modulus of each of the transparent protective panel layer 43 and the display panel layer 41. It is not easy to adjust a thickness and an elastic modulus of the display panel layer 41 whereas it is relatively easy to change a thickness of the transparent protective panel layer 43, and to change an elastic modulus of the transparent protective panel layer 43 by changing a material of the transparent protective panel layer 43.

For example, a basic design condition of the flexible display device 4 having the multi-layer structure of FIG. 4 is as shown in Table 3. In this case, a minimum radius of curvature that does not cause delamination is obtained as shown in Tables 4 and 5 by using Equations 15 and 19 by changing a thickness and a yield strain of the transparent protective panel layer 43. Table 5 shows a minimum radius of curvature and a yield strain according to a material of the transparent protective panel layer 43. Referring to Tables 4 and 5, a minimum radius of curvature that does not cause delamination may be adjusted by changing a thickness and a yield strain of the transparent protective panel layer 43.

TABLE 3

| | Thickness (mm) | Elastic modulus (Mpa) | Yield strain ($\varepsilon_Y$) |
|---|---|---|---|
| Transparent protective panel layer 43 | 0.115 | 2774 | 0.025 |
| Second adhesive layer 52 | 0.050 | 5 | 0.200 |
| Touch panel layer 42 | 0.110 | 428 | 0.050 |
| First adhesive layer 51 | 0.050 | 5 | 0.200 |
| Display panel layer 41 | 0.305 | 1361 | 0.050 |

TABLE 4

| Thickness (mm) of the transparent protective panel layer 43 | Minimum radius of curvature (mm) |
|---|---|
| 0.060 | 10.6 |
| 0.120 | 9 |
| 0.180 | 8 |
| 0.240 | 7.5 |

TABLE 5

| Yield strain $\varepsilon_Y$ of the transparent protective panel layer 43 | Minimum radius of curvature (mm) |
|---|---|
| 0.025 | 9.5 |
| 0.030 | 7.7 |
| 0.040 | 5.8 |
| 0.050 | 4.7 |

As described above, a condition in which delamination does not occur may be changed by using a thickness and a yield strain of the transparent protective panel layer 43, and it is easier to change the thickness than the yield strain.

For example, referring to Table 6, assuming that yield strains of the transparent protective panel layer 43 and the display panel layer 41 are both 0.03, when the flexible display device 7 bends to a radius of curvature of 7.7 mm, the strain $E_{i\_center}$ of the central plane of the transparent protective panel layer 43 reaches the yield strain $\varepsilon_Y$, and thus delamination may occur.

TABLE 6

| | Thickness (mm) | Elastic modulus (Mpa) | Yield strain | Strain on the central plane |
|---|---|---|---|---|
| Transparent protective panel layer 43 | 0.115 | 2774 | 0.030 | 0.030 |
| Second adhesive layer 52 | 0.050 | 5 | 0.200 | 0.020 |
| Touch panel layer 42 | 0.110 | 428 | 0.050 | 0.009 |
| First adhesive layer 51 | 0.050 | 5 | 0.200 | −0.001 |
| Display panel layer 41 | 0.305 | 1361 | 0.030 | −0.024 |

In this case, although delamination may be avoided by moving the neutral surface NS toward the transparent protective panel layer 43 by adjusting an elastic modulus or a thickness of the display panel layer 41, since the display panel layer 41 has a structure in which a plurality of functional layers are stacked one another, it is not easy to adjust an elastic modulus or a thickness of the display panel layer 41. Hence, the neutral surface NS may be moved toward the transparent protective panel layer 43 by increasing a thickness of the transparent protective panel layer 43. Referring to Table 7, the strain $\varepsilon_{i\text{-}center}$ of the central plane of the transparent protective panel layer 43 when the flexible display device 4 bends to a radius of curvature of 7.7 mm may be less than the yield strain $\varepsilon_Y$ by increasing a thickness of the transparent protective panel layer 43 to 0.145 mm.

TABLE 7

| | Thickness (mm) | Elastic modulus (Mpa) | Yield strain | Strain on the central plane |
|---|---|---|---|---|
| Transparent protective panel layer 43 | 0.145 | 2774 | 0.030 | 0.028 |
| Second adhesive layer 52 | 0.050 | 5 | 0.200 | 0.016 |
| Touch panel layer 42 | 0.110 | 428 | 0.050 | 0.005 |
| First adhesive layer 51 | 0.050 | 5 | 0.200 | −0.005 |
| Display panel layer 41 | 0.305 | 1361 | 0.030 | −0.028 |

In addition, referring to Table 8, it is found that delamination may be avoided even when the flexible display device 4 bends to a radius of curvature of 7.4 mm by increasing a thickness of the transparent protective panel layer 43 to 0.145 mm.

TABLE 8

| | Thickness (mm) | Elastic modulus (Mpa) | Yield strain | Strain on the central plane |
|---|---|---|---|---|
| Transparent protective panel layer 43 | 0.145 | 2774 | 0.030 | 0.030 |
| Second adhesive layer 52 | 0.050 | 5 | 0.200 | 0.016 |
| Touch panel layer 42 | 0.110 | 428 | 0.050 | 0.006 |
| First adhesive layer 51 | 0.050 | 5 | 0.200 | −0.005 |
| Display panel layer 41 | 0.305 | 1361 | 0.030 | −0.029 |

In order to realize the foldable electronic device 100 that may fold into a compact size, a minimum radius of curvature of the flexible display device 4 needs to be less than about 10 mm. To this end, yield strains of the transparent protective panel layer 43 and the display panel layer 41 which most greatly affect the minimum radius of curvature of the flexible display device 4 need to be equal to or greater than 0.01. In addition, the radius of curvature r may be set to be a smallest value that does not cause plastic delamination by enabling the transparent protective panel layer 43 and the display panel layer 41 to simultaneously reach the yield strains. In addition, thicknesses of the transparent protective panel layer 43 and the display panel layer 41 may be determined so that the elastic strains of the transparent protective panel layer 43 and the display panel layer 41 are almost the same when the radius of curvature is r.

Buckling Delamination Considering Adhesive Force of Adhesive Layer

When considering experimental results, in a multi-layer film in which layers are adhered to one another by using an adhesive layer, a condition in which the layers are delaminated may vary according to an adhesive state and an adhesive force of the adhesive layer. This may be because of imperfection of the adhesive state and thus a difference of the adhesive force. The imperfection of the adhesive state may be expressed as a length of a fine air-void that is formed in an adhesive surface. The length of the fine air-void may be obtained through a bending experiment as follows.

Figure 9:
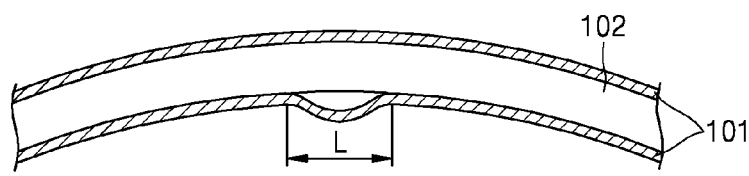
FIG. 9 is a reference view for obtaining a buckling delamination condition according to an embodiment of the present disclosure.

FIG. 9 is a reference view for obtaining a bucking delamination condition according to an embodiment of the present disclosure.

Referring to FIG. 9, a film 101 having a thickness T and a width W is adhered to an adhesive layer 102. A fine air-void having a length L is formed in the adhesive layer 102. Delamination may occur due to buckling in the fine air-void when the film 101 bends. In this case, when an elastic modulus of the film 101 is E, a moment of inertia of the film 101 is I, and a buckling mode number is n, a force $P_{cr}$ with which the bucking occurs is $$P_{cr} = \frac{n^2\pi^2 EI}{L^2} = \frac{n^2\pi^2 E}{L^2} \times \frac{wT^3}{12}. \qquad \text{Equation 20}$$

When a strain when the buckling occurs is $\varepsilon_{buckling}$, the force Par is $$P_{cr} = wTE\varepsilon_{buckling}\frac{n^2\pi^2 E}{L^2} \times \frac{wT^3}{12}. \qquad \text{Equation 21}$$

Accordingly, the strain $\varepsilon_{buckling}$ is $$\varepsilon_{buckling} = \frac{n^2\pi^2}{12L^2} \times T^2. \qquad \text{Equation 22}$$

In order to avoid delamination due to buckling when the length of the fine air-void is L, the strain $\varepsilon_{i\text{-}center}$ of the central plane of the film 101 has to be less than the strain $\varepsilon_{buckling}$ when the buckling occurs. In this regard, a condition in which buckling delamination does not occur in the flexible display device 4 having the multi-layer structure of FIG. 4 is $$\varepsilon_{i-center} = \frac{|p_i - y_N|}{r} < \varepsilon_{buckling} = \frac{n^2\pi^2}{12L^2} \times T_i^2.$$ Equation 23

Since the buckling mode number n is 1, a minimum radius of curvature that does not cause buckling delamination is $$r > \frac{12L^2|P_i - y_N|}{\pi^2 T_i^2}.$$ Equation 24

In Equation 24, the length L of the fine air-void when two films are attached to each other by using a specific adhesive film may be obtained through the bending experiment of FIG. 9. When an average of radii of curvature when the film 101 of FIG. 9 bends and delamination occurs is $r_m$, an average length L of fine air-voids of the film 101 is $$L = \pi T_i \left(\frac{r_m}{12|P_i - y_N|}\right)^{1/2}.$$ Equation 25

In this case, Ti and Pi are values for the film 101 having delamination. More particularly, an effect of plastic deformation may be disregarded when the bending experiment is performed with the value Ti of 0.05 mm or less.

For example, assuming that a condition of each layer of the flexible display device 4 is as shown in Table 1 and the length L of the fine air-void of the first and second adhesive layers 51 and 52 which is obtained through the bending experiment is 0.4 mm, when the flexible display device 4 bends to the radius of curvature r of 5 mm, the strain $\varepsilon_{buckling}$ is calculated as shown in Table 9.

TABLE 9

|  | T(mm) | E(Mpa) | $\varepsilon_Y$ | $\varepsilon_{i\text{-}center}$ | $\varepsilon_{buckling}$ |
|---|---|---|---|---|---|
| Transparent protective panel layer 43 | 0.115 | 2774 | 0.050 | 0.047 | 0.0680 |
| Second adhesive layer 52 | 0.050 | 5 | 0.200 | 0.030 | 0.0129 |
| Touch panel layer 42 | 0.110 | 428 | 0.050 | 0.014 | 0.0622 |
| First adhesive layer 51 | 0.050 | 5 | 0.200 | −0.002 | 0.0129 |
| Display panel layer 41 | 0.305 | 1361 | 0.050 | −0.037 | 0.4782 |

Referring to Table 9, even when the flexible display device 4 bends to the radius of curvature r of 5 mm in the above condition, since the strain $\varepsilon_{i\text{-}center}$ of the central plane of each layer is less than the strain $\varepsilon_{buckling}$, delamination is not expected to occur. If the length L of the fine air-void of the first and second adhesive layers 51 and 52 is 0.6 mm, the strain $\varepsilon_{buckling}$ of the transparent protective panel layer 43 is 0.03, and thus there is a possibility that the transparent protective panel layer 43 undergoes delamination.

An effect of a thickness and an elastic modulus of each layer on a radius of curvature r_1 that satisfies a plastic delamination condition of Equation 19 and a radius of curvature r_2 that satisfies a buckling delamination condition of Equation 24 will now be described.

Figure 10:
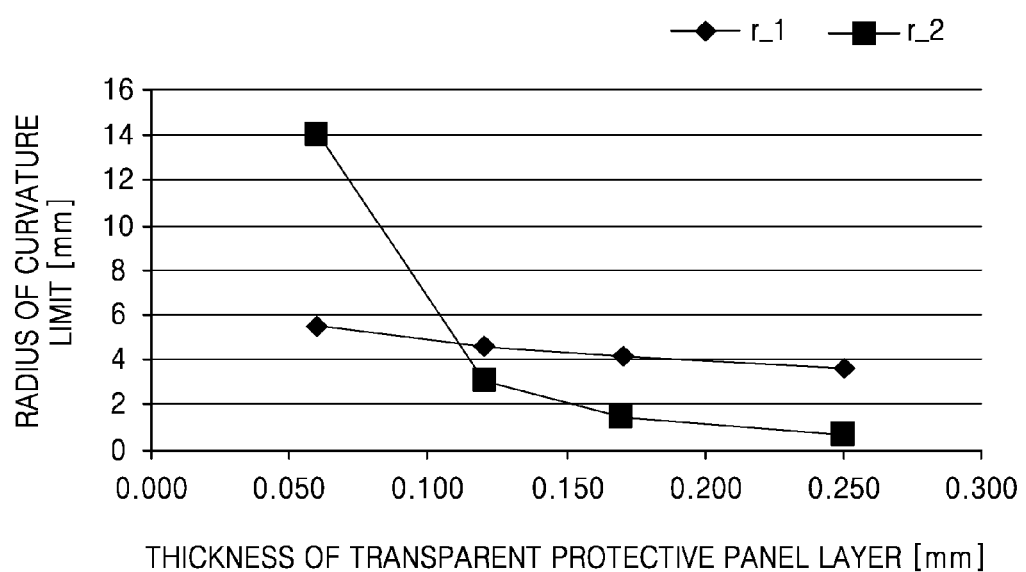
FIG. 10 is a graph illustrating an effect of a thickness of a transparent protective panel layer in a condition of Table 1 on a radius of curvature r_1 that satisfies a plastic delamination condition and a radius of curvature r_2 that satisfies a buckling delamination condition according to an embodiment of the present disclosure.

FIG. 10 is a graph illustrating an effect of a thickness of a transparent protective panel layer in a condition of Table 1 on a radius of curvature r_1 that satisfies a plastic delamination condition and a radius of curvature r_2 that satisfies a buckling delamination condition according to an embodiment of the present disclosure.

First, referring to FIG. 10, Table 10 and a graph of FIG. 10 show an effect of a thickness of the transparent protective panel layer 43 in the condition of Table 1 on the radius of curvature r_1 that satisfies the plastic delamination condition and the radius of curvature r_2 that satisfies the buckling delamination condition. The length L of the fine air-void is 0.4 mm.

TABLE 10

| Thickness (mm) of the transparent protective panel layer 43 | r_1(mm) | r_2(mm) |
|---|---|---|
| 0.060 | 5.4 | 14 |
| 0.120 | 4.6 | 3.1 |
| 0.170 | 4.2 | 1.4 |
| 0.250 | 3.7 | 0.6 |

Figure 11:
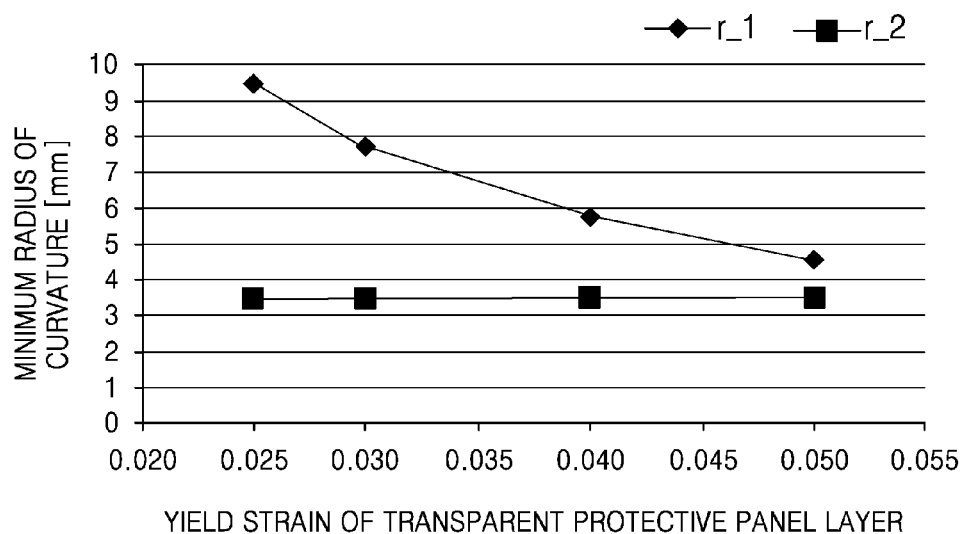
FIG. 11 is a graph illustrating an effect of an elastic modulus of a transparent protective panel layer in a condition of Table 1 on a radius of curvature r_1 that satisfies a plastic delamination condition and a radius of curvature r_2 that satisfies a buckling delamination condition according to an embodiment of the present disclosure.

FIG. 11 is a graph illustrating an effect of an elastic modulus of a transparent protective panel layer in a condition of Table 1 on a radius of curvature r_1 that satisfies a plastic delamination condition and a radius of curvature r_2 that satisfies a buckling delamination condition according to an embodiment of the present disclosure.

Thereafter, referring to FIG. 11, Table 11 and a graph of FIG. 11 show an effect of a yield strain of the transparent protective panel layer 43 in the condition of Table 1 on the radius of curvature r_1 that satisfies the plastic delamination condition and the radius of curvature r_2 that satisfies the buckling delamination condition. The length L of the fine air-void is 0.4 mm.

TABLE 11

| Yield strain of the transparent protective panel layer 43 | r_1(mm) | r_2(mm) |
|---|---|---|
| 0.025 | 9.5 | 3.5 |
| 0.030 | 7.7 | 3.5 |
| 0.040 | 5.8 | 3.5 |
| 0.050 | 4.6 | 3.5 |

Figure 12:
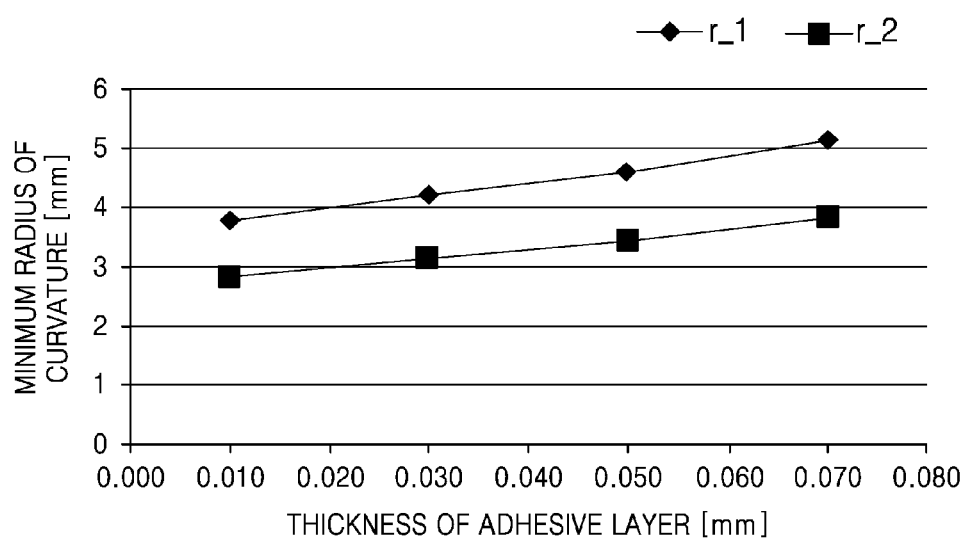
FIG. 12 is a graph illustrating an effect of a thickness of an adhesive layer in a condition of Table 1 on a radius of curvature r_1 that satisfies a plastic delamination condition and a radius of curvature r_2 that satisfies a buckling delamination condition according to an embodiment of the present disclosure.

FIG. 12 is a graph illustrating an effect of a thickness of an adhesive layer in a condition of Table 1 on a radius of curvature r_1 that satisfies a plastic delamination condition and a radius of curvature r_2 that satisfies a buckling delamination condition according to an embodiment of the present disclosure.

Thereafter, referring to FIG. 12, Table 12 and a graph of FIG. 12 show an effect of a thickness of the first and second adhesive layers 51 and 52 in the condition of Table 1 on the radius of curvature r_1 that satisfies the plastic delamination condition and the radius of curvature r_2 that satisfies the buckling delamination condition. The length L of the fine air-void is 0.4 mm.

TABLE 12

| Thickness (mm) of the first and second adhesive layers 51 and 52 | r_1(mm) | r_2(mm) |
|---|---|---|
| 0.010 | 3.8 | 2.8 |
| 0.030 | 4.2 | 3.1 |
| 0.050 | 4.6 | 3.4 |
| 0.070 | 5.1 | 3.8 |

Referring to the graphs of FIGS. 10, 11, and 12, a thickness of the transparent protective panel layer 43 most greatly affects the radius of curvature r_1 that satisfies the plastic delamination condition and the radius of curvature r_2 that satisfies the buckling delamination condition. In addition, it is found that even when the transparent protective panel layer 43 bends to a radius of curvature that causes plastic deformation, delamination due to buckling does not always occur. Hence, instead of setting design criteria of the flexible display device 4 to a yield strain, the design criteria may be set to a strain $\varepsilon_{crit}$ considering a strain in a state where buckling occurs. When $\varepsilon_{crit} = \varepsilon_y \times C(r)$, the strain $\varepsilon_{crit}$ that is the design criteria may be obtained as a function of the radius of curvature r through a simulation.

Figure 13:
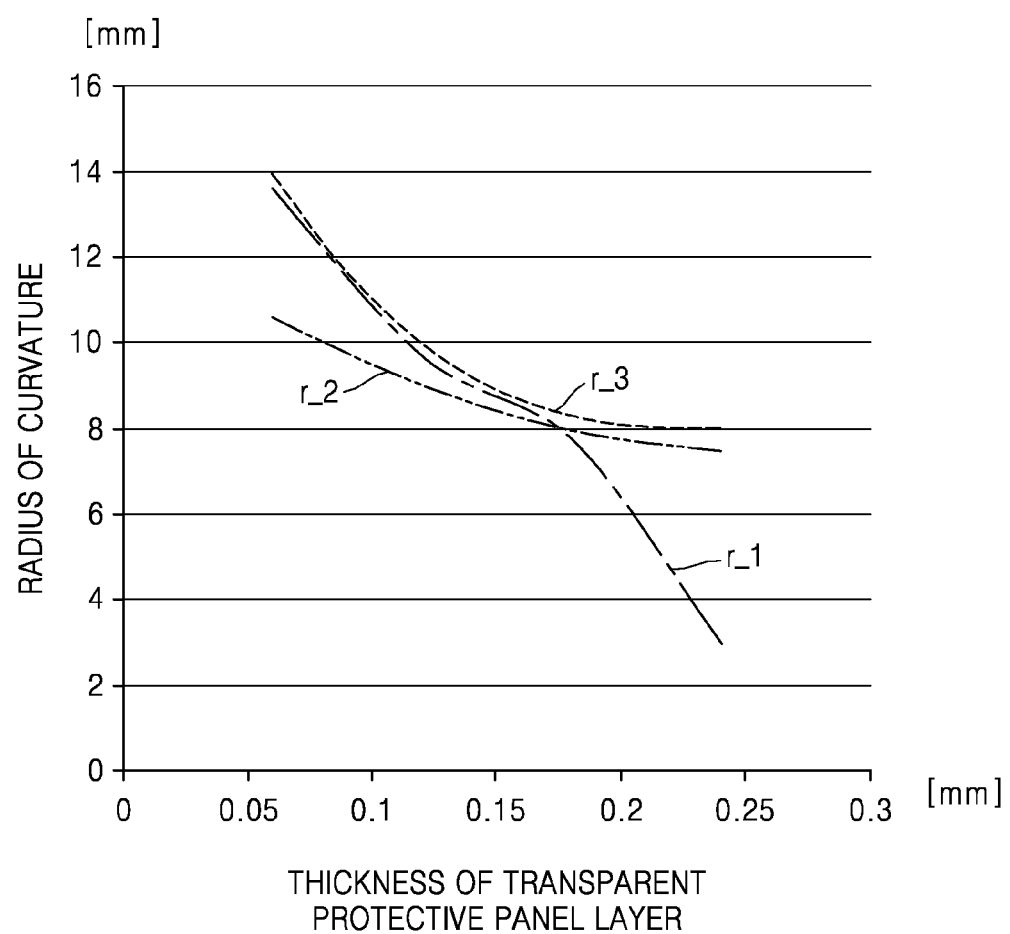
FIG. 13 is a graph illustrating a process of determining a range of a radius of curvature r that satisfies a plastic delamination condition and a buckling delamination condition through a simulation according to an embodiment of the present disclosure.

FIG. 13 is a graph illustrating a process of determining a range of a radius of curvature r that satisfies a plastic delamination condition and a buckling delamination condition through a simulation according to an embodiment of the present disclosure.

Referring to FIG. 13, the horizontal axis represents a thickness of the transparent protective panel layer 43 and the vertical axis represents the radius of curvature r. The radius of curvature r of the flexible display device 4 may be determined to be greater than a radius of curvature r_3 that satisfies the radii of curvature r_1 and r_2. For example, a thickness of the transparent protective panel layer 43 may be determined so that the radius of curvature r is greater than the radius of curvature r_3. Referring to FIG. 13, the radius of curvature r_3 may be approximated by a polynomial that is a function of the thickness of the transparent protective panel layer 43. For example, in FIG. 13, when the thickness of the transparent protective panel layer 43 is X, the radius of curvature r may be determined to satisfy $r > -694.44X^3 + 569.44X^2 - 151.67X + 21.2$.

Adhesion After Plastic Deformation

In the flexible display device 4 having the multi-layer structure, at least one layer may be adhered to another layer after being permanently deformed to have a radius of curvature or after being permanently deformed and being spread flat.

Figure 14:
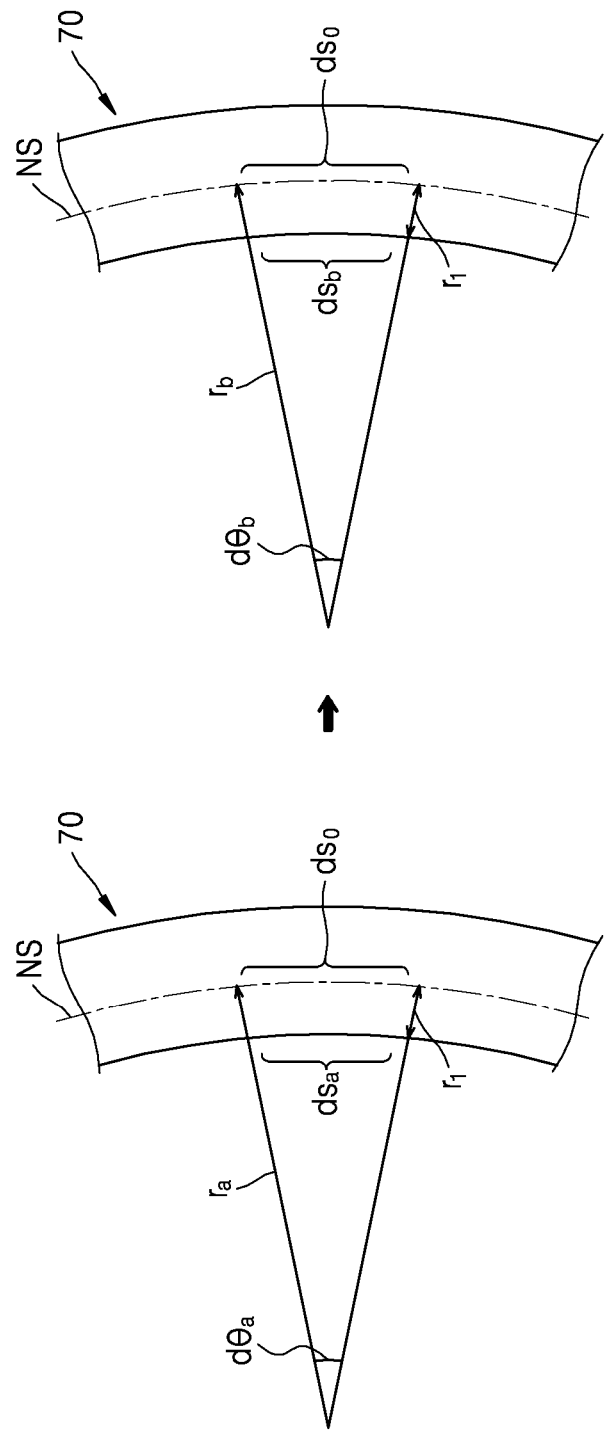
FIG. 14 is a view illustrating a case where a film that is permanently deformed to a radius of curvature $r_a$ is elastic-deformed to a radius of curvature $r_b$ ($r_a$>$r_b$) according to an embodiment of the present disclosure.

FIG. 14 is a view illustrating a case where a film that is permanently deformed to a radius of curvature $r_a$ is elastic-deformed to a radius of curvature $r_b$ ($r_a > r_b$) according to an embodiment of the present disclosure.

When a film 70 changes from a bending state having the radius of curvature $r_a$ to a completely unfolded state, since $$dS_0 = r_a d\theta_a \qquad \text{Equation 26, and}$$

$$dS_a = (r_a - r1) d\theta_a \qquad \text{Equation 27}$$

an elastic strain $\varepsilon_a$ is $$\varepsilon_a = \frac{(dS_a - dS_0)}{dS_0} = -\frac{r1}{r_a}. \qquad \text{Equation 28}$$

In addition, when the film 70 changes from the bending state having the radius of curvature $r_a$ to a bending state having the radius of curvature $r_b$, since $$dS_0 = r_a d\theta_a = r_b d\theta_b, \qquad \text{Equation 29}$$

$$d\theta_b = \frac{r_a}{r_b} d\theta_a, \text{ and} \qquad \text{Equation 30}$$

$$dS_b = (r_a - r1) d\theta_b = \frac{r_a(r_b - r1)}{r_b} d\theta_a, \qquad \text{Equation 31}$$

an elastic strain $\varepsilon_b$ is $$\varepsilon_b = \frac{dS_b - dS_a}{dS_a} = \frac{r1 - \frac{r1 r_a}{r_b}}{r_b - r1}. \qquad \text{Equation 32}$$

Here, when the elastic strain $\varepsilon_a$ and the elastic strain $\varepsilon_b$ are the same, a maximum effect may be obtained, and thus Equation 33 is obtained:

$$-\frac{r1}{r_a} = \frac{r1 - \frac{r1 r_a}{r_b}}{r_b - r1} \qquad \text{Equation 33}$$

$$r_b = \frac{r_a}{2 - \frac{r1}{r_a}} = \frac{r_a^2}{2r_a - r1} \approx \frac{r_a}{2}. \qquad \text{Equation 34}$$

From Equation 34, when the film 70 is plastic-deformed to the radius of curvature $r_a$, the film 70 may be elastic-deformed to a radius of curvature that is a half of the radius of curvature $r_a$. Hence, in order to elastic-deform the film 70 to the radius of curvature $r_b$, the film 70 may be plastic-deformed to have a radius of curvature that is equal to or greater than the radius of curvature $r_b$ and is equal to or less than $2r_b$. In this case, a process of changing from the bending state having the radius of curvature $r_a$ to the completely unfolded state and the bending state having the radius of curvature $r_b$ has to be a process of elastic-deforming the film 70. Hence, the elastic strain $\varepsilon_a$ and the elastic strain $\varepsilon_b$ have to be less than a yield strain of the film 70.

Figure 15:
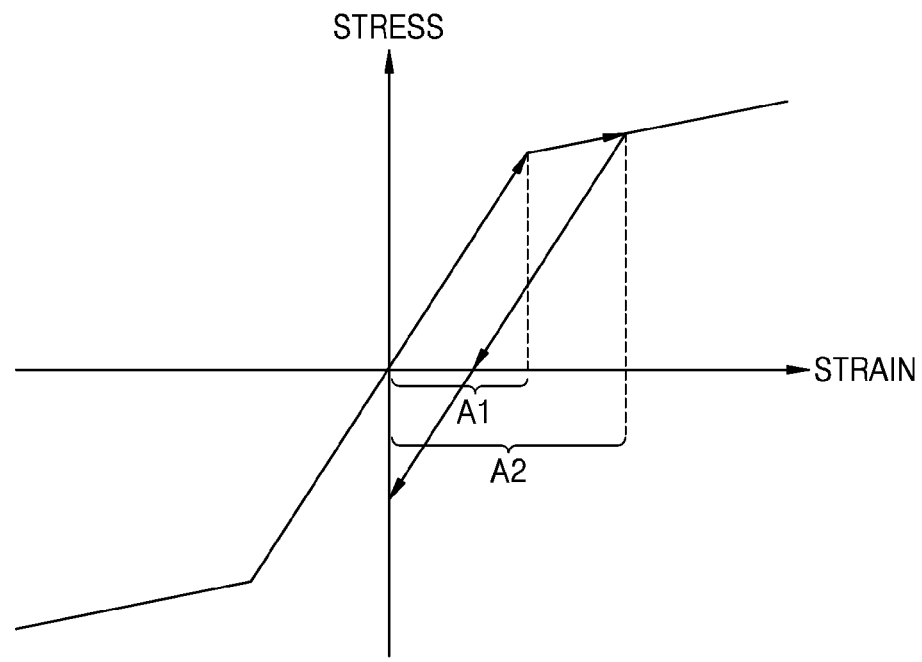
FIG. 15 is a graph illustrating a stress-strain curve when adhesion after plastic deformation is performed according to an embodiment of the present disclosure.

FIG. 15 is a graph illustrating a stress-strain curve when adhesion after plastic deformation is performed according to an embodiment of the present disclosure.

Referring to FIG. 15, an elastic deformation area increases from A1 before plastic deformation to A2 after the plastic deformation.

In order to plastic-deform the film 70 to the radius of curvature $r_a$, the film 70 is permanently deformed by being plastic-deformed to a radius of curvature $r_c$ that is less than the radius of curvature $r_a$. The radius of curvature $r_c$ for plastic-deformation may range from about ⅓ to about ⅔ of the radius of curvature $r_a$. When the radius of curvature $r_c$ is less than ⅓ of the radius of curvature $r_a$, a curved line may be produced in the film 70. More particularly, when the film 70 is transparent, a transmittance of the film 70 may be reduced due to efflorescence. In addition, when the radius of curvature $r_c$ is greater than 3/2 of the radius of curvature $r_a$, the radius of curvature $r_a$ may not be obtained, or it may take a long time to obtain the radius of curvature $r_a$, thereby increasing manufacturing costs.

An adhesion after plastic-deformation process may be applied to a process of manufacturing the flexible display device 4 having the multi-layer structure in which a plurality of panel layers are sequentially adhered to one another. For example, a first curvature portion 82 (see FIGS. 16A and 16B) may be formed by plastic-deforming one (first panel layer) from among the plurality of panel layers and the first panel layer may be adhered to another panel layer (second panel layer). In this case, the second panel layer may be supported on a jig 80 (see FIG. 16A) having a second curvature portion 81 (see FIG. 16A) corresponding to the first curvature portion 82 (see FIG. 16A), and the first panel layer that is plastic-deformed may be adhered to the second panel layer. In this case, the second panel layer may also be plastic-deformed to have a certain curvature portion. In addition, the second panel layer may be supported on a flat jig 80a (see FIG. 16B), and the first panel layer may be elastic-deformed to be spread flat and may be adhered to the second panel layer.

The adhesion after plastic-deformation process may be applied to all panel layers that constitute the flexible display device 4. For example, when a function of the display panel layer 41 or the touch panel layer 42 is maintained after plastic-deformation during adhesion, the adhesion after plastic-deformation process may be applied to the display panel layers 41 and the touch panel layer 42. In addition, the adhesion after plastic-deformation process may be applied to a panel layer having no function, for example, the transparent protective panel layer 43. For example, referring to Table 6, assuming that yield strains of both the transparent protective panel layer 43 and the display panel layer 41 are 0.03, when the flexible display device 4 bends to a radius of curvature of 7.7 mm, the strain $\varepsilon_{i\text{-}center}$ of the central plane of the transparent protective panel layer 43 may reach the yield strain $\varepsilon_y$, and thus delamination may occur. In this case, instead of changing a thickness or an elastic modulus of the transparent protective panel layer 43, the transparent protective panel layer 43 may be permanently deformed to the radius of curvature $r_a$ that is equal to or less than double a minimum radius of curvature of 7.7 mm, may be spread flat again, and may be adhered to the touch panel layer 42 by using the second adhesive layer 52. In this structure, delamination may not occur even when the flexible display device 4 bends to the minimum radius of curvature of 7.7 mm without changing designs of the flexible display device 4 and the foldable electronic device 100 including the flexible display device 4.

Figure 16A:
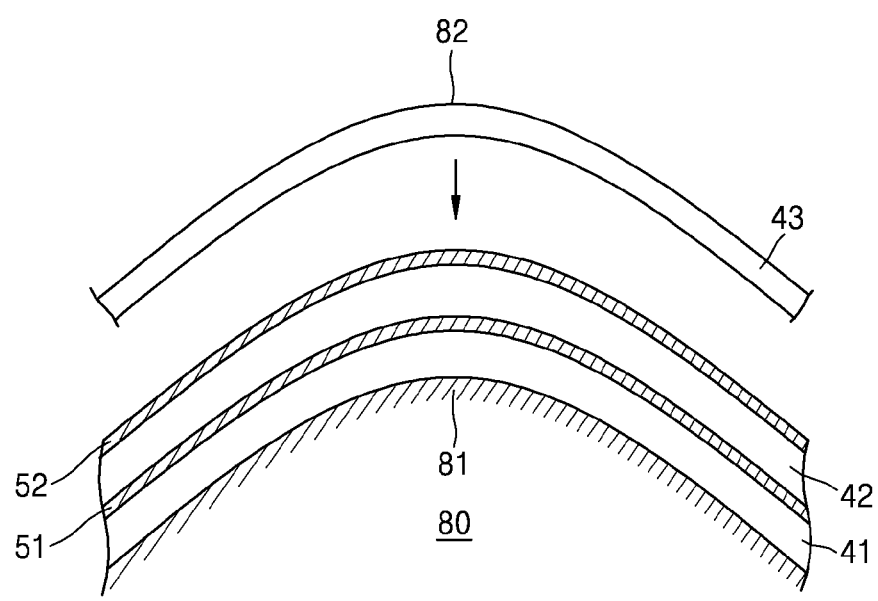
FIG. 16A is a cross-sectional view illustrating a process of performing an adhesion after a plastic-deformation process according to an embodiment of the present disclosure.

FIG. 16A is a cross-sectional view illustrating a process of performing an adhesion after a plastic-deformation process according to an embodiment of the present disclosure.

Referring to FIG. 16A, the first curvature portion 82 having a radius of curvature may be formed by plastic-deforming the display panel layer 41, the touch panel layer 42, and the transparent protective panel layer 43, the layers 41, 42, and 43 may be sequentially supported by the jig 80 including the second curvature portion 81 corresponding to the first curvature portion 82, and the layers 41, 42, and 43 may be sequentially adhered to one another. Alternatively, the display panel layer 41 and the touch panel layer 42 which are adhered to each other by using the first adhesive layer 51 without being plastic-deformed may be supported on the jig 80, and the transparent protective panel layer 43 that is plastic-deformed to include the first curvature portion 82 may be adhered to the touch panel layer 42 by using the second adhesive layer 52.

Figure 16B:
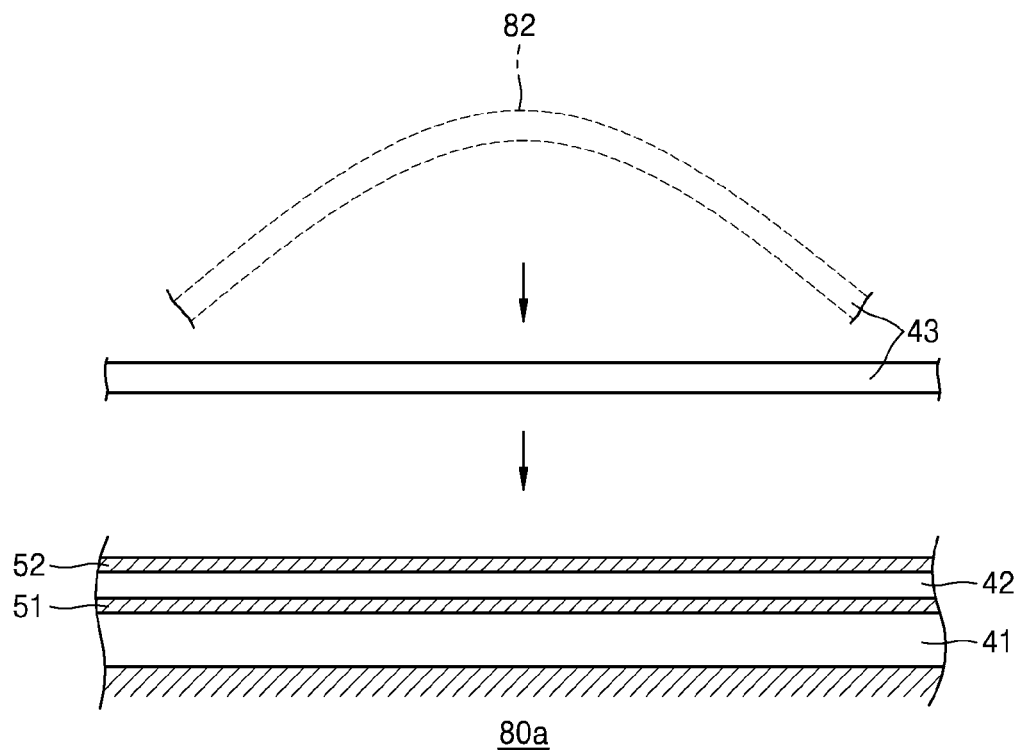
FIG. 16B is a cross-sectional view illustrating a process of performing an adhesion after a plastic-deformation process according to an embodiment of the present disclosure.

FIG. 16B is a cross-sectional view illustrating a process of performing an adhesion after a plastic-deformation process according to an embodiment of the present disclosure.

Referring to FIG. 16B, the display panel layer 41, the touch panel layer 42, and the transparent protective panel layer 43 which are plastic-deformed may be elastic-deformed, may be spread flat, may be sequentially stacked on the flat jig 80a, and may be adhered to each other by using the first and second adhesive layers 51 and 52. Alternatively, the display panel layer 41 and the touch panel layer 42 which are adhered to each other by using the first adhesive layer 51 without being plastic-deformed may be supported on the jig 80a, and the transparent protective panel layer 43 that is plastic-deformed to include the first curvature portion 82 as marked by a dashed line may be elastic-deformed to be spread flat as marked by a solid line and may be adhered to the touch panel layer 42 by using the second adhesive layer 52.

Figure 16C:
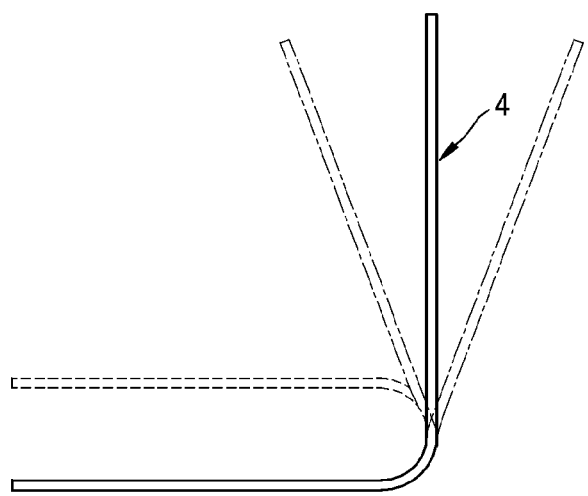
FIG. 16C is a side view illustrating a flexible display device formed by a plastic-deformation process to a radius of curvature $r_a$ and an adhesion process in which the flexible display device is deformed by a plastic-deformation process according to an embodiment of the present disclosure.

FIG. 16C is a side view illustrating a flexible display device formed by a plastic-deformation process to a radius of curvature $r_a$ and an adhesion process in which the flexible display device is deformed by a plastic-deformation process according to an embodiment of the present disclosure.

Referring to FIG. 16C, when adhesion is performed in a state where the display panel layer 41, the touch panel layer 42, and the transparent protective panel layer 43 of the flexible display device 4 are deformed to the radius of curvature $r_a$ as marked by a solid line, the flexible display device 4 may have a radius of curvature that ranges from about 80% to about 120% of the radius of curvature $r_a$ as marked by a dashed dotted line when no force is applied and may bend to the radius of curvature $r_b$ that corresponds to a half of the minimum radius of curvature $r_a$ as marked by a dashed line.

The flexible display device 4 having the multi-layer structure which is manufactured by using the adhesion after plastic-deformation process tends to be maintained in a bending state as marked by as a dashed dotted line of FIG. 16C when no external force is applied to the flexible display device 4. Hence, in order to use the foldable electronic device 100 to which the flexible display device 4 is applied in the unfolded state of FIGS. 1 and 2, the flexible display device 4 has to be maintained in an unfolded state while the user holds the first and second bodies 1 and 2. In addition, even in the flexible display device 4 having the multi-layer structure which is manufactured by using an adhesion process in a flat state, user convenience may be improved when the flexible display device 4 is maintained in the unfolded state as shown in FIGS. 1 and 2.

In this regard, the foldable electronic device 100 may have a structure for maintaining an unfolded state of the flexible display device 4.

Figure 17:
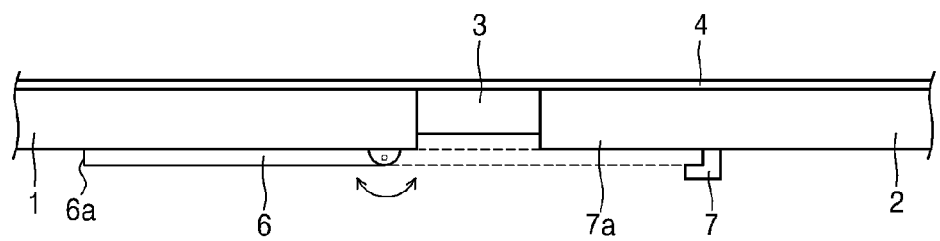
FIGS. 17 and 18 are side views illustrating a foldable electronic device having a structure for maintaining an unfolded state according to an embodiment of the present disclosure.
Figure 18:
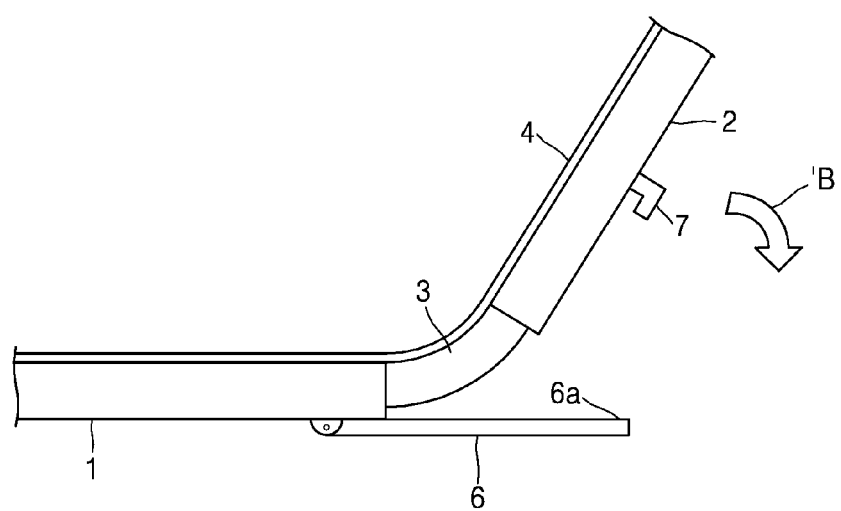

FIGS. 17 and 18 are side views illustrating a foldable electronic device having a structure for maintaining an unfolded state according to an embodiment of the present disclosure.

Referring to FIG. 17, a support member 6 is provided on the first body 1 and a locking unit 7 is provided on the second body 2. The support member 6 changes between a first position at which the support member 6 is received in the first body 1 as marked by a solid line and a second position at which the support member 6 extends toward the second body 2 across the connection unit 3 as marked by a dashed line. Referring to FIG. 17, the support member 6 is pivotably provided on the first body 1. A pivotable connection structure between the support member 6 and the first body 1 may be any of various well-known connection structures, such as a hinge structure. For example, the locking unit 7 may be shaped to receive an end portion 6a of the support member 6. Although not shown in FIG. 17, the locking unit 7 may include a structure that may elastically receive the end portion 6a of the support member 6. For example, the locking unit 7 may include a snap-fit structure. In addition, the locking unit 7 may include a structure that may elastically move in a longitudinal direction of the second body 2. When the first body 1 and the second body 2 reach an unfolded state of FIG. 17, the foldable electronic device 100 may be maintained in the unfolded state by pivoting the support member 6 to the second position and locking the support member 6 by using the locking unit 7.

Referring to FIG. 18, the first and second bodies 1 and 2 of the foldable electronic device 100 may be stably maintained without falling in a direction marked by an arrow B even in an unfolded state having a certain angle between the unfolded state (hereinafter, completely unfolded state, see FIG. 2) and the folded state (hereinafter, completely folded state, see FIG. 3) by locating the support member 6 at the second position.

Figure 19:
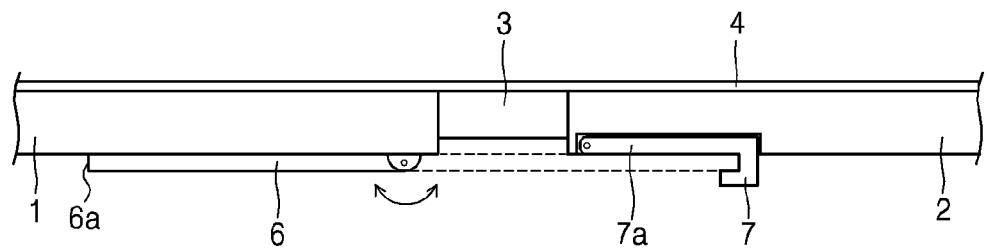
FIGS. 19 and 20 are side views illustrating a foldable electronic device having a structure for maintaining an unfolded state according to an embodiment of the present disclosure.
Figure 20:
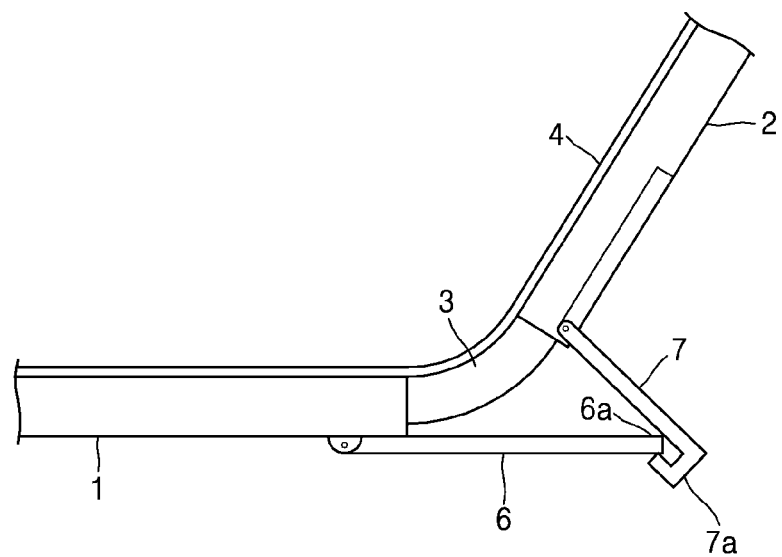

FIGS. 19 and 20 are side views illustrating a foldable electronic device having a structure for maintaining an unfolded state according to an embodiment of the present disclosure.

Referring to FIGS. 19 and 20, a locking member 7a that changes between a third position at which the locking member 7a locks the support member 6 in an unfolded state and a fourth position at which the locking member 7a locks the support member 6 in an unfolded state having a certain angle between the completely unfolded state (see FIG. 2) and the completely folded state (see FIG. 3) is provided on the second body 2. The locking member 7a includes the locking unit 7 for locking the support member 6. For example, the locking member 7a is provided on the second body 2 to pivot between the third and fourth positions. A pivot center of the locking member 7a is closer to the connection unit 3 than to the locking unit 7. The locking unit 7 may include a structure that may elastically receive the end portion 6a of the support member 6. For example, the locking unit 7 may include a snap-fit structure. In addition, the locking unit 7 may include a structure that may elastically move in a longitudinal direction of the second body 2 with respect to the locking member 7a.

In this structure, when the foldable electronic device 100 completely unfolds, as shown in FIG. 19, the support member 6 that is located at the second position is locked by the locking unit 7 and the foldable electronic device 100 may be maintained in a completely unfolded state. In addition, as shown in FIG. 20, when the locking member 7a may pivot to the fourth position to lock the support member 6 that is located at the second position, the foldable electronic device 100 may be maintained in an unfolded state having a certain angle between the completely unfolded state (see FIG. 2) and the completely folded state (see FIG. 3) of the first and second bodies 1 and 2.

Figure 21:
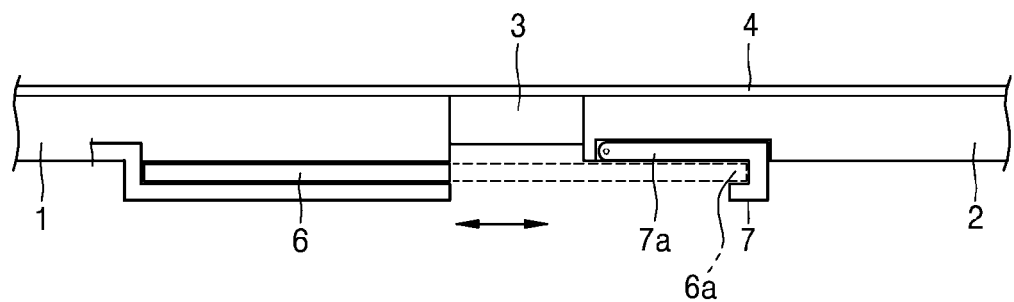
FIGS. 21 and 22 are side views illustrating a foldable electronic device having a structure for maintaining an unfolded state according to an embodiment of the present disclosure.
Figure 22:
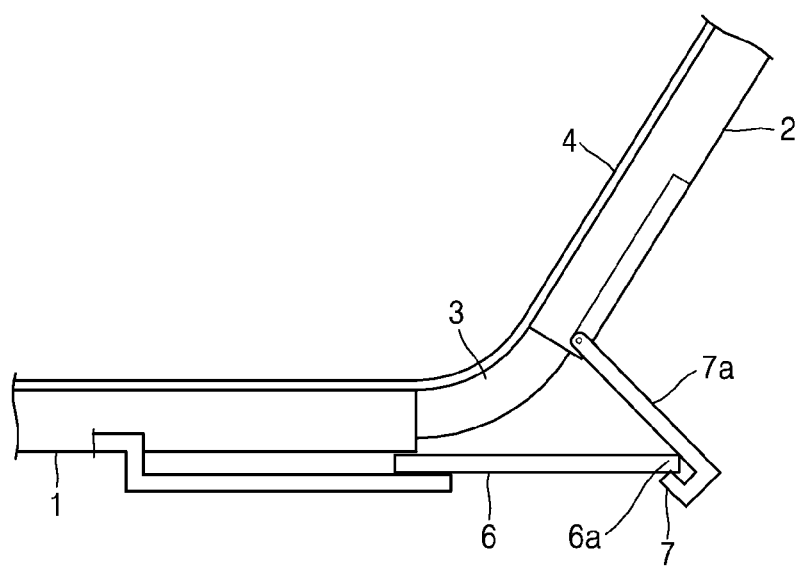

FIGS. 21 and 22 are side views illustrating a foldable electronic device having a structure for maintaining an unfolded state according to an embodiment of the present disclosure.

Referring to FIGS. 21 and 22, the support member 6 may be provided on the first body 1 to slide between the first and second positions. In this structure, when the foldable electronic device 100 completely unfolds as shown in FIG. 21, the support member 6 that slides to the second position may be locked by the locking unit 7 and the foldable electronic device 100 may be maintained in a completely unfolded state. In this case, the locking unit 7 may not be a separate product but may be integrally formed as a groove with the second body 2. In addition, as shown in FIG. 22, when the locking member 7a may pivot to the fourth position to lock the support member 6 that slides to the second position, the foldable electronic device 100 may be maintained in an unfolded state having a certain angle between the completely unfolded state (see FIG. 2) and the completely folded state (see FIG. 3) of the first and second bodies 1 and 2.

Certain aspects of the present disclosure can also be embodied as computer readable code on a non-transitory computer readable recording medium. A non-transitory computer readable recording medium is any data storage device that can store data which can be thereafter read by a computer system. Examples of the non-transitory computer readable recording medium include Read-Only Memory (ROM), Random-Access Memory (RAM), Compact Disc-ROMs (CD-ROMs), magnetic tapes, floppy disks, and optical data storage devices. The non-transitory computer readable recording medium can also be distributed over network coupled computer systems so that the computer readable code is stored and executed in a distributed fashion. In addition, functional programs, code, and code segments for accomplishing the present disclosure can be easily construed by programmers skilled in the art to which the present disclosure pertains.

At this point it should be noted that the various embodiments of the present disclosure as described above typically involve the processing of input data and the generation of output data to some extent. This input data processing and output data generation may be implemented in hardware or software in combination with hardware. For example, specific electronic components may be employed in a mobile device or similar or related circuitry for implementing the functions associated with the various embodiments of the present disclosure as described above. Alternatively, one or more processors operating in accordance with stored instructions may implement the functions associated with the various embodiments of the present disclosure as described above. If such is the case, it is within the scope of the present disclosure that such instructions may be stored on one or more non-transitory processor readable mediums. Examples of the processor readable mediums include a ROM, a RAM, CD-ROMs, magnetic tapes, floppy disks, and optical data storage devices. The processor readable mediums can also be distributed over network coupled computer systems so that the instructions are stored and executed in a distributed fashion. In addition, functional computer programs, instructions, and instruction segments for accomplishing the present disclosure can be easily construed by programmers skilled in the art to which the present disclosure pertains.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A flexible display device that is foldable so that a neutral surface thereof has a radius of curvature, the flexible display device comprising:
   a plurality of panel layers that is sequentially stacked on one another, wherein the plurality of panel layers comprises a display panel layer configured to display an image, and a transparent protective panel layer; and
   a plurality of adhesive layers that sequentially adhere the plurality of panel layers to one another,
   wherein, based on an elastic modulus and a thickness of each of the plurality of adhesive layers and the plurality of panel layers, the neutral surface is located on a layer other than the display panel layer, and
   wherein a position of the neutral surface is determined so that when the flexible display device is in a folding state, the transparent protective panel layer and the display panel layer simultaneously reach a yield strain.

2. A flexible display device that is foldable so that a neutral surface thereof has a radius of curvature, the flexible display device comprising:
   a plurality of panel layers that is sequentially stacked on one another, wherein the plurality of panel layers comprises a display panel layer configured to display an image, and a transparent protective panel layer; and a plurality of adhesive layers that sequentially adhere the plurality of panel layers to one another, wherein, based on an elastic modulus and a thickness of each of the plurality of adhesive layers and the plurality of panel layers, the neutral surface is located on a layer other than the display panel layer, and wherein the elastic modulus and the thickness of each of the plurality of adhesive layers and the plurality of panel layers are determined so that when the flexible display device is in a folding state, the transparent protective panel layer and the display panel layer simultaneously reach a yield strain.

* * * * *